United States Patent
Schroeder et al.

(10) Patent No.: US 10,248,754 B2
(45) Date of Patent: Apr. 2, 2019

(54) MULTI-STAGE PATTERN RECOGNITION IN CIRCUIT DESIGNS

(71) Applicant: GLOBALFOUNDRIES INC., Grand Cayman (KY)

(72) Inventors: Uwe Paul Schroeder, Santa Cruz, CA (US); Fadi Batarseh, Corona, CA (US); Karthik Krishnamoorthy, Santa Clara, CA (US); Ahmed Omran, Austin, TX (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 32 days.

(21) Appl. No.: 15/602,810

(22) Filed: May 23, 2017

(65) Prior Publication Data

US 2018/0341739 A1  Nov. 29, 2018

(51) Int. Cl.
   *G06F 17/50* (2006.01)
(52) U.S. Cl.
   CPC ................ *G06F 17/5081* (2013.01)
(58) Field of Classification Search
   CPC .................................................. G06F 17/5081
   USPC ................................. 716/106–107, 110–111
   See application file for complete search history.

(56) References Cited

U.S. PATENT DOCUMENTS

| | | | |
|---|---|---|---|
| 7,523,429 B2 | 4/2009 | Kroyan et al. | |
| 7,962,873 B2 * | 6/2011 | Su | G06F 17/5068 716/106 |
| 8,347,239 B2 * | 1/2013 | Miloslavsky | G03F 7/70433 716/52 |
| 8,356,271 B2 | 1/2013 | Kim et al. | |
| 8,504,949 B2 | 8/2013 | Robles et al. | |
| 8,612,899 B2 * | 12/2013 | Miloslavsky | G03F 7/70433 430/30 |
| 9,026,954 B2 | 5/2015 | Perez et al. | |
| 9,081,919 B2 | 7/2015 | Dai et al. | |
| 2003/0204817 A1 * | 10/2003 | Kashyap | G06F 17/5036 716/102 |
| 2007/0184369 A1 * | 8/2007 | Abrams | G03F 1/36 430/30 |
| 2008/0148211 A1 | 6/2008 | Dai et al. | |
| 2008/0295063 A1 * | 11/2008 | Svidenko | G06F 17/5081 716/55 |
| 2014/0343884 A1 | 11/2014 | Leu | |

\* cited by examiner

*Primary Examiner* — Stacy Whitmore
(74) *Attorney, Agent, or Firm* — Gibb & Riley, LLC; David A. Cain, Esq.

(57) ABSTRACT

An identification of a first area of an IC design surrounding a failure component is received; and, in response, a smaller portion of the first area is selected. The smaller portion also surrounds the failure component, is smaller than the first area, and contains less circuit components than the first area. The smaller portion is matched to other areas of the IC design to identify potentially undesirable patterns of the IC design that are the same size as the first area. Additionally, the potentially undesirable patterns are grouped into pattern categories, the pattern categories are matched to known good pattern categories, and the known good patterns are removed from the potentially undesirable patterns to leave potential failure patterns. The potential failure patterns of the IC design are then output.

20 Claims, 4 Drawing Sheets

MULTI-STAGE PATTERN RECOGNITION IN CIRCUIT DESIGNS

BACKGROUND

Field of the Invention

The present disclosure relates to evaluating circuit designs, and more specifically, to methods and systems that perform multi-stage pattern recognition in circuit designs.

Description of the Related Art

Because of the scale and complexity of semiconductor designs, it can be challenging to identify design issues. Pattern matching is one method to find and identify design weak points in semiconductor IC designs; however, specifying the pattern correctly such that there are no false positives (incorrectly identifying a matching pattern), while avoiding missing any correct matches, is a very challenging technological problem.

In order to address these challenges, some systems introduce fuzziness (a range of edge placements that are accepted as match), flexible fuzziness (where each edge can have a specific degree of fuzziness), or use Don't Care Areas (areas where the occurrence of a shape does not influence the pattern match), to give the most accurate representation of a weak point in an abstract pattern match description. Also, Design Finishing (DF) can often fix many of the pattern matches, if there is enough space; however it is difficult to anticipate DF capability in order to highlight only non-fixable patterns to the designer.

SUMMARY

Exemplary methods herein automatically and continuously evaluate known good integrated circuit (IC) designs (e.g., using empirical evidence) to generate known good pattern categories (e.g., using a processor of one or more computerized devices). The known good pattern categories can be maintained in one or more databases.

At various times, the methods herein receive an IC design (made up of components, such as capacitors, resistors, and transistors electrically connected to each other by conductive connectors, all of which have shapes) into an input/output device of the computerized device(s), and receive an identification of a first area of an IC design surrounding a marker (e.g., possible failure component) into the input/output device. In response, these methods automatically select a smaller portion of the first area, using the processor. The smaller portion also surrounds the failure component, is smaller than the first area, and contains less circuit components than the first area.

Further, these methods automatically match the smaller portion to other areas of the IC design to identify potentially undesirable patterns of the IC design that are the same size as the first area (again using the processor). The process of matching the smaller portion to other areas of the IC design involves matching shapes in the smaller portion to shapes of the IC design that are centered around failure components, and this generates matching IC shape areas; and identifies areas that are the same size as the first area. The matching algorithm can either utilize exact matching, or employ fuzzy matching where edges can be placed within a predefined range to create a positive match. Thus, the failure component is in the center of the first area, in the center of the smaller portion, and in the center of the potentially undesirable patterns.

Additionally, these methods automatically group the potentially undesirable patterns into pattern categories, automatically match the pattern categories to known good pattern categories, and automatically remove the known good pattern categories from the potentially undesirable patterns, to leave potential failure patterns (all using the processor). This removes false positives from the potentially undesirable patterns, and with this these methods can automatically output the potential failure patterns that have a higher likelihood of process failure of the IC design from the input/output device.

Various systems herein include, among other components, at least one processor, at least one input/output device, at least one electronic computer storage, etc., all directly or indirectly electrically connected to each other. The input/output device receives an identification of a first area of an IC design surrounding a failure component. The processor automatically selects a smaller portion of the first area that surrounds the failure component, is smaller than the first area, and contains less circuit components than the first area.

The processor also automatically matches the smaller portion to other areas of the IC design to identify potentially undesirable patterns of the IC design that are the same size as the first area. The processor matches the smaller portion to other areas of the IC design by matching shapes in the smaller portion to shapes of the IC design that are centered around failure components to generate matching IC shape areas. In doing so, the processor identifies areas that are the same size as the first area surrounding each of the failure components of each of the matching IC shape areas.

Additionally, the processor groups the potentially undesirable patterns into pattern categories, matches the pattern categories to known good pattern categories in the electronic computer storage, and removes the known good pattern categories from the potentially undesirable patterns to leave potential failure patterns, and this removes false positives from the potentially undesirable patterns. The processor automatically and continuously generates the known good pattern categories using empirical evidence, and maintains the known good pattern categories in one or more databases in the electronic computer storage. The input/output device automatically outputs the potential failure patterns of the IC design.

BRIEF DESCRIPTION OF THE DRAWINGS

The embodiments herein will be better understood from the following detailed description with reference to the drawings, which are not necessarily drawn to scale and in which.

DETAILED DESCRIPTION

As mentioned above, when evaluating semiconductor designs, pattern matching can be helpful; however, it is a very challenging technological problem to produce a pattern matching system that does not miss weak points, while at the same time eliminating false positives. In other words, avoiding missing weak points and avoiding false positives are mutually exclusive goals because increasing the size/complexity of the pattern that is used for matching decreases the number of patterns that will match, which increases the amount of weak points that are missed (but produces the benefit of reducing false positives). To the contrary, decreasing the size/complexity of a pattern that is matched to increases the number of patterns that will match, which decreases the amount of weak points that are missed (but produces the disadvantage of increasing false positives). The systems and methods herein address these issues by using a multi-stage pattern match, where the first pattern matching stage is relatively generic and produces a relatively large number of matches (and thus catches many fixable false positives), and the second stage subtracts known fixable matches and leaves only problematic patterns (without many false positives).

The methods and systems herein use a relatively small first stage care area, and keep a relatively clear description of pattern matches, which is easy to document and explain to designers; however, this produces millions of matches, with many false positives. Therefore, in the second stage, all matches from first stage are classified into sub-categories, based on an enlarged care area. This takes place during pattern match (PM) deck definition, based on actual design data, or enumerated layouts.

Additionally, methods and systems herein automatically generate a known good pattern database (e.g., based on OPC/DF (Optical Proximity Correction/Design Finishing simulation)). If the fail criteria are not met post OPC/DF, a classified pattern gets tagged with "known good" property. Therefore, the second stage database (having the known good patterns) is subtracted from first stage database to generate final weak point pattern database output, visible to designer. The known good pattern database can be updated dynamically with new tapeouts, without the need to replace existing pattern description in design manual. The design finishing and OPC assessment happens under the hood without disclosing fab internal trade secrets to outside world.

Figure 2:
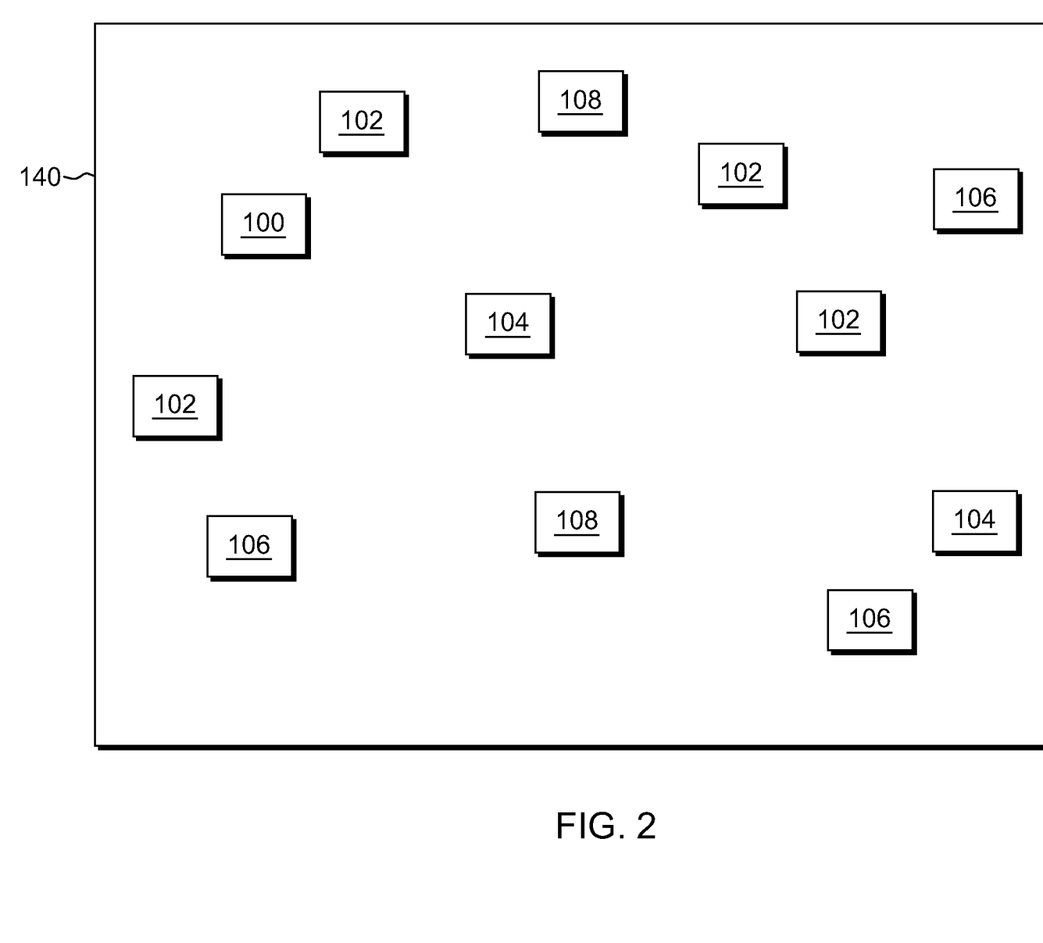
FIG. 2 is a schematic diagram illustrating an IC design having areas of patterns.

The methods herein receive an identification of a first area 100 of an IC design 140 surrounding a marker (e.g., possible failure component 122) into the input/output device. For example, the failure component 122 could be an insulator that the circuit designer is concerned will fail and cause a short between adjacent conductive structures. FIG. 2 illustrates the IC design 140 that includes the first area 100, and many other areas 102-108 that have shapes that match some of the shapes in the first area 100.

Figure 1:
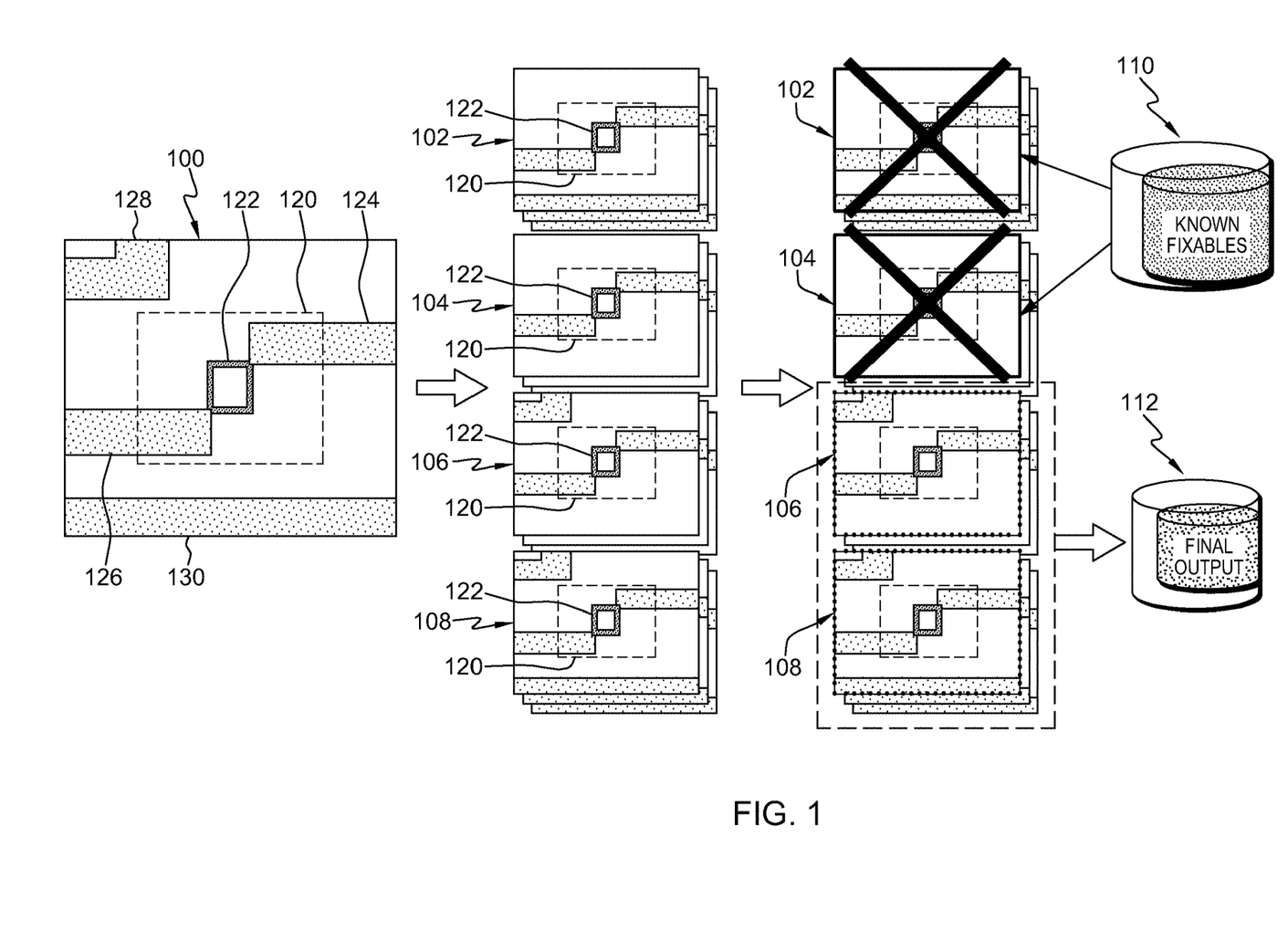
FIG. 1 is a schematic diagram illustrating pattern matching performed by systems and methods herein.

Rather than searching for matches using the entire first area 100 (which might miss some weak areas); instead these methods automatically (using the processor) select a smaller portion 120 of the first area 100. By requiring the designer to use a smaller portion 120 than the designer would select, the methods herein dramatically increase the number of matches that will be produced, and ask less of the designer of the pattern matching deck, because the number and complexity of shapes in the smaller portion 120 will be less, making the designation of shapes to search simpler for the designer.

Note, as shown in FIG. 1, the smaller portion 120 also surrounds the failure component 122, is smaller than the first area 100, and contains less circuit components than the first area 100. Further, these methods automatically match just the smaller portion 120 to other areas of the IC design 140 to identify potentially undesirable patterns 102-108 of the IC design 140; which are the same size as the first area 100, but include within them an area matching the shapes in the smaller portion 120 (again using the processor).

The process of matching the smaller portion 120 to corresponding areas of the IC design 140 involves matching shapes in the smaller portion 120 to shapes of the IC design 140 that are centered on failure components 122, and this generates the matching IC shape areas 102-108 that are the same size as the first area 100. Thus, the failure component 122 is in the center of the first area 100, in the center of the smaller portion 120, and in the center of the potentially undesirable patterns 102-108.

Additionally, these methods automatically group the potentially undesirable patterns 102-108 into pattern categories (shown by the stacks within potentially undesirable patterns 102-108 in FIG. 1). Therefore, each pattern category will have different shapes. For example, the category that contains the group of potentially undesirable patterns 102 includes 3 shapes; the category that contains the group of potentially undesirable patterns 104 includes 2 shapes; the category that contains the group of potentially undesirable patterns 106 includes 3 shapes (but different from 102); and the category that contains the group of potentially undesirable patterns 108 includes 4 shapes that exactly match the shapes in the first area 100.

In order to reduce or eliminate the number of false positives output, these methods automatically match the pattern categories to known good pattern categories maintained in storage 110 (e.g., known fixables). Also, as shown by the large "X" over the groups of potentially undesirable patterns 102-104, such methods automatically remove the categories of patterns 102-104 matching known good pattern categories from the potentially undesirable patterns 102-108, to leave only the potential failure patterns 106-108 (all using the processor). This removes false positives 102-104 from the potentially undesirable patterns 102-108, and with this, these methods can automatically output 112 the potential failure patterns 106-108 of the IC design 140.

While the known good pattern categories 102-104 include shapes 124, 126 that are adjacent the failure component 122, they do not include both shapes 128 and 130. As is understood by those ordinarily skilled in the art, adjacent shapes have influence upon one another; and, the lack of both shapes 128 and 130 can (and in this example, does) prevent failures from occurring in the failure component 122. Therefore, some combinations of shapes (124-130) surrounding the failure component 122 (e.g., shape combinations in potentially undesirable patterns 102-104) may not result in high numbers of failures; or known shape changes ("fixes") can be applied to such shape patterns to result in an acceptably low number failures. To the contrary, some combinations of shapes (124-130) surrounding the failure component 122 (e.g., shape combinations in potentially undesirable patterns 106-108) may result in unacceptably high numbers of failures; and no known fixes can be applied to such shape patterns to reduce the number to an acceptable number failures. Such "known good" shape information is maintained in the "known fixable" shape pattern categories in storage 110, and allows the unacceptably large number of matches that the reduced size smaller portion 120 produces (e.g., all of 102-108) to be reduced down to a much smaller number of potential failure patterns 106-108 (from which false positives 102-104 have been removed).

In other words, the methods and systems herein identify weak points in a semiconductor design using a pattern matching process that includes multiple steps, where the first step is a generic pattern matching process that creates a large number of matches, and the second step subtracts a multitude of known good pattern configurations from patterns found in the first pattern matching step. The patterns used in the first step are smaller, simpler, and/or more generic than the known good patterns in the second pattern matching step. Additionally, the known good patterns in the second step will also contain the patterns used in the first pattern matching step.

By conducting a multi-stage process, there are very few weak point misses. New weak points (areas that would have an unacceptably high number of failures) that may emerge in new designs are automatically caught. Also, updates to the second stage database 110 can be done without updating design manuals. Further, the known good pattern database generation flow is fully automated with no manual intervention required. Thus, with the methods and systems herein, it is easy to document the fail pattern database due to generic patterns being matched in the first stage. This eliminates complicated patterns and customer confusion, while maintaining low count in the final pattern match database 112. Hence, it is easy to address the remaining pattern matches by redesign. Also, these methods and systems find new and unknown weak points on new incoming designs, if it matches the generic type, with very few misses.

Figure 3:
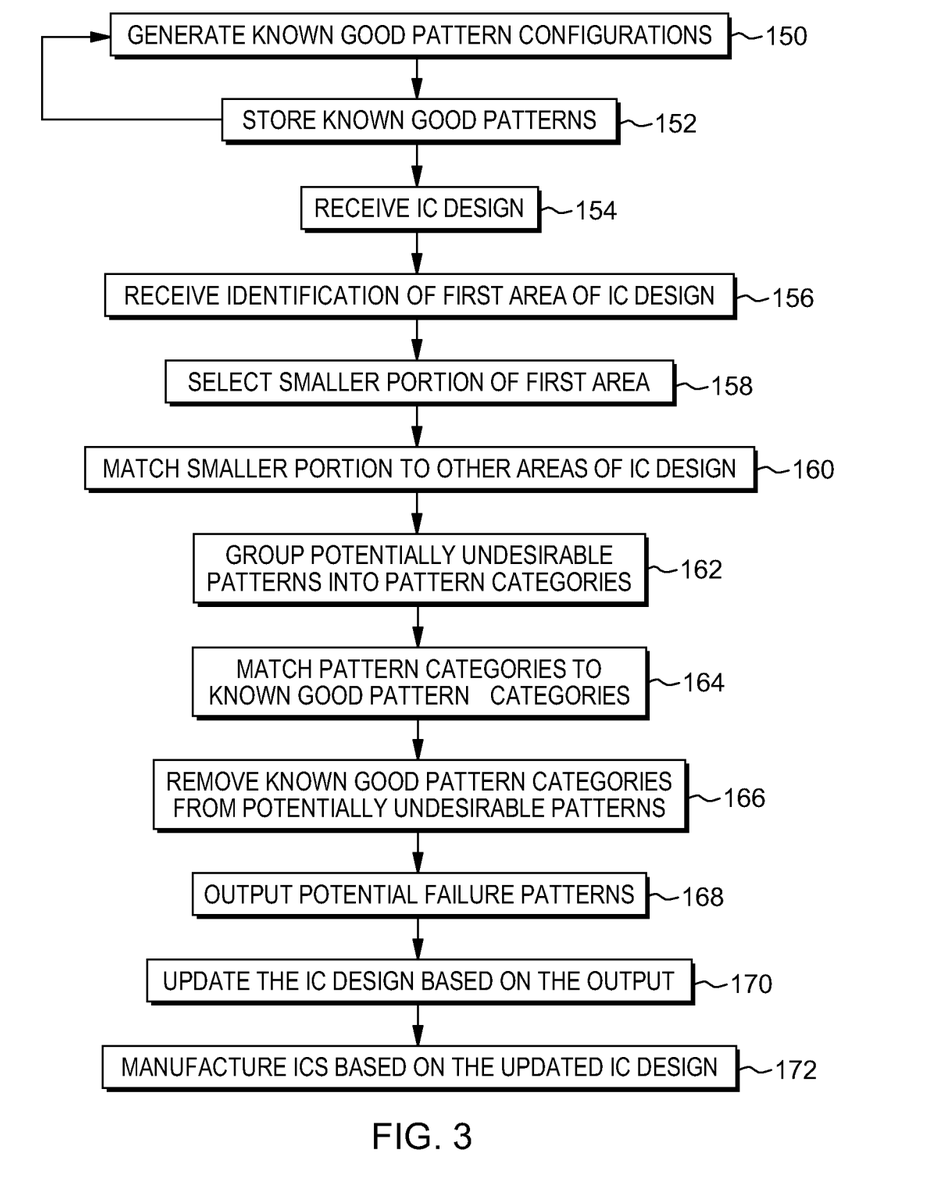
FIG. 3 is a flow diagram illustrating embodiments herein.

As shown in FIG. 3, in item 150, various exemplary methods herein automatically evaluate known good integrated circuit (IC) designs to generate known good pattern configurations using a processor of a computerized device. The known good pattern configurations can be maintained in one or more databases in the electronic computer storage, as shown in item 152, and this process is continually and automatically carried out as shown by the loop back arrow.

At some point, as shown arbitrarily in item 154, these methods receive an IC design into an input/output device of the computerized device, and the IC design has components (e.g., capacitors, resistors, and transistors electrically connected to each other by conductive "wire" connectors). In item 156, these methods also receive an identification of a first area of the IC design surrounding a marker (e.g., possible failure component) into the input/output device. In response, in item 158, these methods automatically select a smaller portion of the first area, using the processor. The smaller portion also surrounds the failure component, is smaller than the first area, and contains less circuit components than the first area.

Further, in item 160, these methods automatically match the smaller portion to other areas of the IC design to identify potentially undesirable patterns of the IC design that are the same size as the first area (again using the processor). The process of matching the smaller portion to other areas of the IC design in item 160 involves matching shapes in the smaller portion to shapes of the IC design that are centered around failure components, and this generates matching IC shape areas; and identifies areas that are the same size as the first area. Thus, the failure component is in the center of the first area, in the center of the smaller portion, and in the center of the potentially undesirable patterns.

Additionally, in item 162, these methods automatically group the potentially undesirable patterns into pattern categories, automatically match the pattern categories to known good pattern categories in item 164, and automatically remove the known good pattern categories from the potentially undesirable patterns in item 166, to leave potential failure patterns (all using the processor). This removes false positives from the potentially undesirable patterns, and with this these methods can automatically output the potential failure patterns of the IC design from the input/output device, in item 168.

The IC design can be automatically updated (i.e., amended or adjusted) based on the output at item 168 in order to avoid or at least minimize the occurrence of such potential failure patterns, in item 170. The updated IC design can be stored in memory and IC chips can subsequently be manufactured based on that updated IC design, in item 172, in order to minimize device failures.

Figure 4:
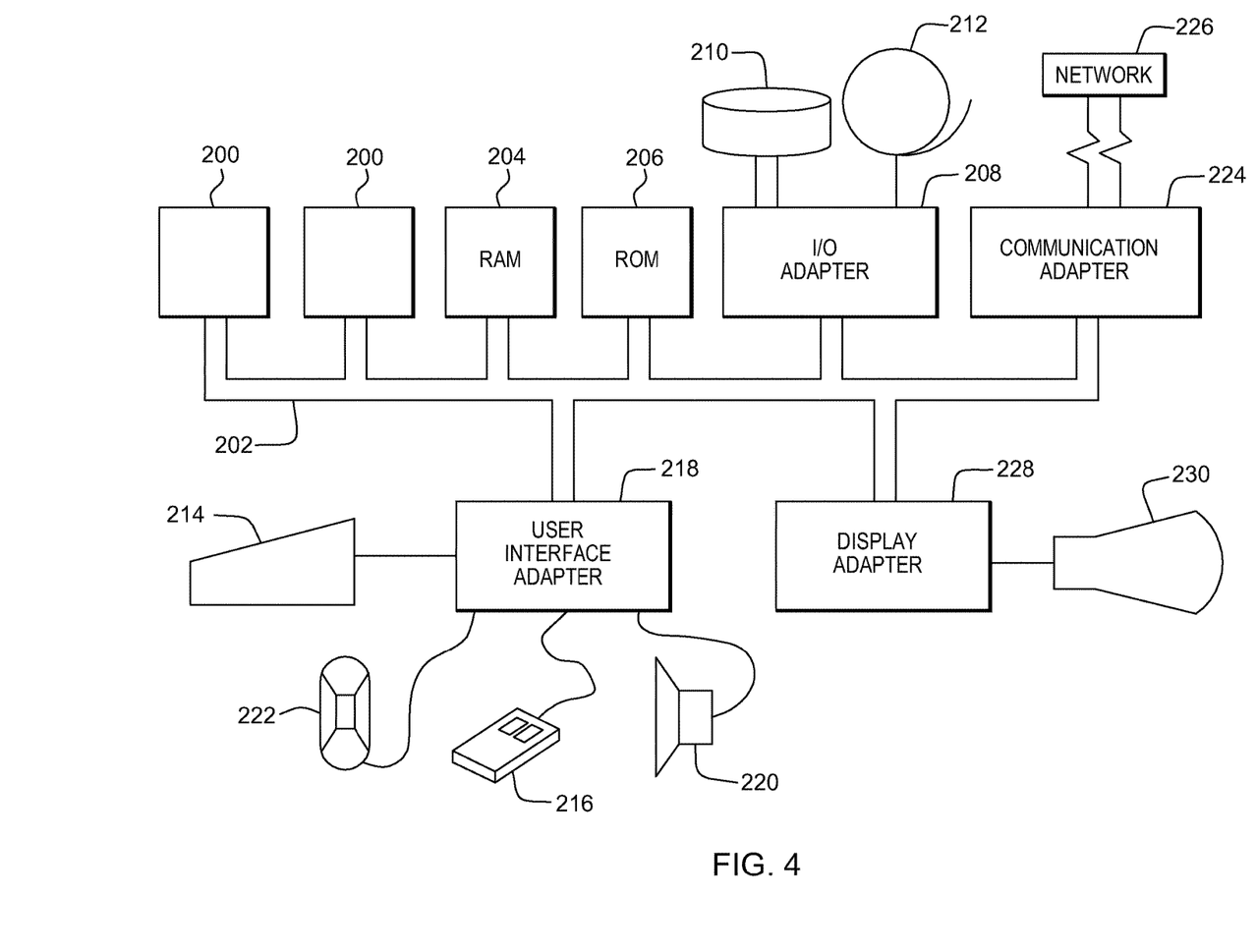
FIG. 4 is a schematic diagram of a hardware system according to embodiments herein.

A representative hardware environment (i.e., a computer system) for implementing the systems, methods, and computer program products disclosed above is depicted in FIG. 4. This schematic drawing illustrates a hardware configuration of an information handling/computer system in accordance with the embodiments herein. The system incorporates at least one processor or central processing unit (CPU) 200. The CPUs 200 are interconnected via a system bus 202 to various devices such as a random access memory (RAM) 204, read-only memory (ROM) 206, and an input/output (I/O) adapter 208. The I/O adapter 208 can connect to peripheral devices, such as disk units 210 and tape drives 212, or other program storage devices that are readable by the system. The system can read the inventive instructions on the program storage devices and follow these instructions to execute the methodology of the embodiments herein. The system further includes a user interface adapter 218 that connects a keyboard 214, mouse 216, speaker 220, microphone 222, and/or other user interface devices such as a touch screen device (not shown) to the bus 202 to gather user input. Additionally, a communication adapter 224 connects the bus 202 to a data processing network 226, and a display adapter 228 connects the bus 202 to a display device 230 which may be embodied as an output device such as a monitor, printer, or transmitter, for example.

Therefore, as shown above, various systems herein include, among other components, a processor 200; and an input/output device 208, and an electronic computer storage 210, 212, both electrically connected to the processor 200. The input/output device 208 receives an identification of a first area of an IC design surrounding a failure component. The processor 200 automatically selects a smaller portion of the first area that surrounds the failure component, is smaller than the first area designated by the designer, and contains less circuit components than the first area.

The processor 200 also automatically matches the smaller portion to other areas of the IC design to identify potentially undesirable patterns of the IC design (that are the same size as the first area, but that include a pattern (somewhere internally) matching the smaller portion). The processor 200 matches the smaller portion to other areas of the IC design by matching shapes in the smaller portion to shapes of the IC design that are centered around the same type of failure components to generate matching IC shape areas. In doing so, the processor 200 identifies areas that are the same size as the first area surrounding each of the failure components of each of the matching IC shape areas.

Additionally, the processor 200 groups the potentially undesirable patterns into pattern categories, matches the pattern categories to known good pattern categories in the electronic computer storage 210, 212, and removes the known good pattern categories from the potentially undesirable patterns to leave potential failure patterns, and this removes false positives from the potentially undesirable patterns. The processor 200 automatically and continuously generates the known good pattern categories using empirical evidence, and maintains the known good pattern categories in one or more databases in the electronic computer storage 210, 212. The input/output device 208 automatically outputs the potential failure patterns of the IC design.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise.

Each respective figure, in addition to illustrating methods of and functionality of the present embodiments at various stages, also illustrates the logic of the method as implemented, in whole or in part, by one or more devices and structures. Such devices and structures are configured to (i.e., include one or more components, such as resistors, capacitors, transistors and the like that are connected to enable the performing of a process) implement the method of merging one or more non-transactional stores and one or more thread-specific transactional stores into one or more cache line templates in a store buffer in a store cache. In other words, one or more computer hardware devices can be created that are configured to implement the method and processes described herein with reference to the Figures and their corresponding descriptions.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable other of ordinary skill in the art to understand the embodiments disclosed herein.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method performed by a computerized device executing instructions in a computer-readable electronic computer storage, the method comprising:

receiving an identification of a first area of an integrated circuit (IC) design surrounding a failure component;

automatically selecting a smaller portion of the first area that surrounds the failure component, is smaller than the first area, and contains less circuit components than the first area;

automatically matching the smaller portion to other areas of the IC design to identify potentially undesirable patterns of the IC design that are the same size as the first area;

automatically grouping the potentially undesirable patterns into pattern categories;

automatically matching the pattern categories to known good pattern categories;

automatically removing the known good pattern categories from the potentially undesirable patterns to leave potential failure patterns;

automatically outputting the potential failure patterns of the IC design;
automatically updating the IC design based on the potential failure patterns to produce an updated IC design; and
manufacturing IC devices using the updated IC design.

2. The method according to claim 1, wherein the failure component is in the center of the first area, in the center of the smaller portion, and in the center of the potentially undesirable patterns.

3. The method according to claim 1, wherein the matching of the smaller portion to other areas of the IC design comprises:
matching shapes in the smaller portion to shapes of the IC design that are centered around failure components to generate matching IC shape areas, using exact matching, or utilizing fuzzy edges to match a similar part of the IC design elsewhere, and using no care areas or similarity indexes in pattern definition to create a match that resembles an initial fail point; and
identifying areas that are the same size as the first area surrounding each of the failure components of each of the matching IC shape areas to identify the potentially undesirable patterns.

4. The method according to claim 1, wherein the matching the pattern categories to known good pattern categories removes false positives from the potentially undesirable patterns.

5. The method according to claim 1, further comprising automatically generating the known good pattern categories using empirical evidence.

6. The method according to claim 1, further comprising maintaining the known good pattern categories in one or more databases.

7. The method according to claim 1, wherein the IC design comprises capacitors, resistors, and transistors electrically connected to each other by conductive connectors.

8. A method performed by a computerized device executing instructions in a computer-readable electronic computer storage, the method comprising:
automatically evaluating known good integrated circuit (IC) designs to generate known good pattern categories using a processor of a computerized device;
receiving an IC design into an input/output device of the computerized device;
receiving an identification of a first area of an IC design surrounding a failure component into the input/output device;
automatically selecting a smaller portion of the first area that surrounds the failure component, is smaller than the first area, and contains less circuit components than the first area, using the processor;
automatically matching the smaller portion to other areas of the IC design to identify potentially undesirable patterns of the IC design that are the same size as the first area, using the processor;
automatically grouping the potentially undesirable patterns into pattern categories, using the processor;
automatically matching the pattern categories to known good pattern categories, using the processor;
automatically removing the known good pattern categories from the potentially undesirable patterns to leave potential failure patterns, using the processor;
automatically outputting the potential failure patterns of the IC design from the input/output device;
automatically updating the IC design based on the potential failure patterns to produce an updated IC design; and
manufacturing IC devices using the updated IC design.

9. The method according to claim 8, wherein the failure component is in the center of the first area, in the center of the smaller portion, and in the center of the potentially undesirable patterns.

10. The method according to claim 8, wherein the matching of the smaller portion to other areas of the IC design comprises:
matching shapes in the smaller portion to shapes of the IC design that are centered around failure components to generate matching IC shape areas, using exact matching, or utilizing fuzzy edges to match a similar part of the IC design elsewhere, and using no care areas or similarity indexes in pattern definition to create a match that resembles an initial fail point; and
identifying areas that are the same size as the first area surrounding each of the failure components of each of the matching IC shape areas to identify the potentially undesirable patterns.

11. The method according to claim 8, wherein the matching the pattern categories to known good pattern categories removes false positives from the potentially undesirable patterns.

12. The method according to claim 8, further comprising automatically generating the known good pattern categories using empirical evidence.

13. The method according to claim 8, further comprising maintaining the known good pattern categories in one or more databases.

14. The method according to claim 8, wherein the IC design comprises capacitors, resistors, and transistors electrically connected to each other by conductive connectors.

15. A system comprising:
a processor
an input/output device electrically connected to the processor; and
a computer-readable electronic computer storage electrically connected to the processor,
the input/output device receives an identification of a first area of an integrated circuit (IC) design surrounding a failure component,
the processor automatically executes instructions in the computer-readable electronic computer storage to:
automatically select a smaller portion of the first area that surrounds the failure component, is smaller than the first area, and contains less circuit components than the first area;
automatically match the smaller portion to other areas of the IC design to identify potentially undesirable patterns of the IC design that are the same size as the first area;
automatically group the potentially undesirable patterns into pattern categories;
automatically match the pattern categories to known good pattern categories in the computer-readable electronic computer storage; and
automatically remove the known good pattern categories from the potentially undesirable patterns to leave potential failure patterns,
the input/output device automatically outputs the potential failure patterns of the IC design,
the processor automatically executes the instructions to update the IC design based on the potential failure patterns to produce an updated IC design, and the updated IC design controls equipment to manufacture IC devices.

16. The system according to claim 15, wherein the failure component is in the center of the first area, in the center of the smaller portion, and in the center of the potentially undesirable patterns.

17. The system according to claim 15, wherein the processor matches the smaller portion to other areas of the IC design by:
matching shapes in the smaller portion to shapes of the IC design that are centered around failure components to generate matching IC shape areas, using exact matching, or utilizing fuzzy edges to match a similar part of the IC design elsewhere, and using no care areas or similarity indexes in pattern definition to create a match that resembles an initial fail point; and
identifying areas that are the same size as the first area surrounding each of the failure components of each of the matching IC shape areas to identify the potentially undesirable patterns.

18. The system according to claim 15, wherein the processor matches the pattern categories to known good pattern categories to remove false positives from the potentially undesirable patterns.

19. The system according to claim 15, wherein processor automatically generates the known good pattern categories using empirical evidence.

20. The system according to claim 15, wherein processor automatically maintains the known good pattern categories in one or more databases in the computer-readable electronic computer storage.

* * * * *